United States Patent
Sauerbrey et al.

(10) Patent No.: US 6,559,716 B2
(45) Date of Patent: May 6, 2003

(54) SWITCHABLE OPERATIONAL AMPLIFIER FOR SWITCHED OP-AMP APPLICATIONS

(75) Inventors: Jens Sauerbrey, Taufkirchen (DE); Martin Wittig, Delmenhorst (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/932,892

(22) Filed: Aug. 20, 2001

(65) Prior Publication Data

US 2002/0021168 A1 Feb. 21, 2002

(30) Foreign Application Priority Data

Aug. 18, 2000 (DE) .......................................... 100 40 399

(51) Int. Cl.[7] ............................................... H03F 1/02
(52) U.S. Cl. .......................................................... 330/9
(58) Field of Search ............................. 330/9, 252, 253, 330/269, 277; 327/561–566

(56) References Cited

U.S. PATENT DOCUMENTS

| | | | |
|---|---|---|---|
| 5,745,002 A | * | 4/1998 | Baschirotto et al. ........ 327/337 |
| 5,973,537 A | * | 10/1999 | Baschirotto et al. ........ 327/337 |
| 5,994,960 A | | 11/1999 | Baschirotto et al. ........ 330/253 |
| 6,344,767 B1 | * | 2/2002 | Cheung et al. ............. 327/336 |

FOREIGN PATENT DOCUMENTS

EP 0 899 871 A1 3/1999

OTHER PUBLICATIONS

Jan Crols et al.: "Switched–Opamp: An Approach to Realize Full CMOS Switched–Capacitor Circuits at Very Low Power Supply Voltages", IEEE Journal of Solid–State Circuits, vol. 29, No. 8, Aug. 1994, pp. 936–942.
M. Steyaert et al.: "Switched–Opamp, a Technique for Realising full CMOS Switched–Capacitor Filters at very Low Voltages", Solid State Circuits Conf. 1993 (ESSCIRC 93), pp. 178–181.
A. Baschirotto et al.: "A 1V CMOS fully–differential switched–opamp bandpass ΣΔ modulator", Solid State Circuits Conf. 1997 (ESSCIRC 97), pp. 152–155.
M. Waltari et al.: "Fully differential switched opamp with enhanced common mode feedback", Electronics Letters, vol. 34, No. 23, Nov. 12, 1998, pp. 2181–2182.

* cited by examiner

*Primary Examiner*—My-Trang Nuton
(74) *Attorney, Agent, or Firm*—Laurence A. Greenberg; Werner H. Stemer; Gregory L. Mayback

(57) ABSTRACT

A switchable operational amplifier is presented for switched op amp technology, in which the current through the prestage is reduced during the off phase of the switching clock pulse. In this way, power consumption can be reduced. During the off phase of the switching clock pulse, the current can either be reduced or switched off completely.

16 Claims, 6 Drawing Sheets

SWITCHABLE OPERATIONAL AMPLIFIER FOR SWITCHED OP-AMP APPLICATIONS

BACKGROUND OF THE INVENTION

Field of the Invention

The invention relates to a switchable operational amplifier for switched op amp technology, as well as a method for operating an operational amplifier of this sort.

Switched op amp technology was developed from switched capacitor technology in order to meet the need for ever-lower supply voltages. In switched op amp technology, not only the capacitors, but also the operational amplifier itself is periodically switched on and off using a switching signal. Since each operational amplifier is switched off during approximately 50% of the operating time, a considerable savings in power can be realized using switched op amp technology. Switched op amp technology is suitable in particular for applications in which a low supply voltage and a low power consumption are important, thus, for example for filters, transformers, converters or transducers in mobile radio devices, and for medical purposes (pacemakers, hearing aids), etc.

For use in switched op amp circuits, switchable operational amplifiers are known in which the end stage can be periodically switched on and off using an additional transistor.

SUMMARY OF THE INVENTION

It is accordingly an object of the invention to provide a switchable operational amplifier for switched op-amp applications which overcome the above-mentioned disadvantages of the prior art devices and methods of this general type, which enable an additional reduction of the power consumption of switched op amp circuits.

With the foregoing and other objects in view there is provided, in accordance with the invention, a switchable operational amplifier for switched op amp technology. The operational amplifier includes an end stage periodically switched on and off by a switching clock signal, and a pre-stage connected to the end stage and has a device for reducing a current through the pre-stage. The device reduces the current flowing through the pre-stage during an off phase of the switching clock signal from a first value to a smaller second value.

The inventive switchable operational amplifier has a pre-stage as well as an output or end stage, whereby the end stage can be periodically switched on and off through a switching clock signal. The inventive switchable operational amplifier has a device for reducing the current through the pre-stage, which reduces the current flowing through the pre-stage during the off phase of the switching clock signal switching from a first value to a smaller second value.

During the off phase of the switching clock signal, not only is the current through the end stage switched off, but in addition the current through the pre-stage is also lowered. Through this measure, an additional savings of power can be achieved over the known switchable operational amplifiers, in which the pre-stage also remains switched on during the off phase of the switching clock signal, and therefore constantly consumes current. In order to control the periodic variation of the current through the pre-stage, the same switching clock signal can be used that also periodically switches the end stage on and off. For this reason, the inventive solution can be realized with a low additional circuit outlay.

According to an advantageous specific embodiment of the invention, the device for reducing the current through the pre-stage, switches off the current flowing through the pre-stage during the off phase of the switching clock signal. The complete switching off of the pre-stage during the off phase of the switching clock signal represents the simplest and most economical specific embodiment of the invention. With this solution, the highest possible power savings can be achieved.

Here it is advantageous if the device for reducing the current through the pre-stage includes at least one transistor that switches off the current flowing through the pre-stage during the off phase of the switching clock signal. For the realization of the invention, one additional transistor is sufficient that is clocked by the switching clock signal and that periodically switches the pre-stage on and off. The expense for additional components can therefore be kept very low in this specific embodiment.

According to an alternative specific embodiment of the invention, the device for reducing the current through the pre-stage includes at least one pair of transistors connected in parallel. During the switched-on phase of the switching clock pulse, a first fraction of the current flowing through the pre-stage flows through the respective first transistors of the pair or pairs, and a second fraction of the current flowing through the pre-stage flows through the respective second transistors of the pair or pairs. The overall current through the pre-stage is therefore split in such a manner that a part of the current flows through the first transistors, and the remaining part of the current flows through the second transistors of the pair or pairs. During the off phase of the switching clock signal, the respective second transistors are then switched off. In this way, the overall current flowing through the pre-stage is reduced to the first fraction flowing through the first transistors.

The current portions flowing via the respective transistors depend on the ratio W/L, i.e., the ratio of width to length, of the devices used. In this way, it is possible to set which fraction of the overall current is switched off during the off phase of the switching clock signal. The currents flowing via the first transistors and via the second transistors can however also be set using the bias voltage that is present at the gate of the switching FETs.

The splitting of the overall current has the advantage that a certain flow of current through the pre-stage is maintained even during the off phase of the switching clock signal. In comparison with the complete switching off of the pre-stage, in this way a better activation performance can be achieved. Given higher circuit requirements, it is therefore advantageous not to completely shut off the current through the pre-stage. Given correspondingly smaller dimensioning of the current flowing during the off phase, the power savings is still considerable.

According to another advantageous specific embodiment of the invention, the pre-stage is realized as a convoluted or folded pre-stage having an input branch and an output branch. During the off phase of the switching clock signal, the device for reducing the current through the pre-stage reduces the current flowing in the input branch and/or the current flowing in the output branch.

The use of a convoluted pre-stage having an input branch and an output branch is advantageous in particular in the case of low supply voltages. The current difference occurring in the input branch is transferred 1:1 to the output branch. With a convoluted pre-stage, a high signal level swing at the output of the pre-stage can be achieved even with a low supply voltage.

Given a convoluted pre-stage, there is a flow of current in the input branch of the pre-stage and also a flow of current in the output branch of the pre-stage. If the inventive configuration of a current reduction during the off phase of the switching clock pulse is now applied to a convoluted pre-stage, then either the current flowing in the input branch of the pre-stage or the current flowing in the output branch of the pre-stage can be reduced. The highest power savings is achieved if the current is reduced in both branches.

For this purpose, it is advantageous if the input branch of the pre-stage includes at least one pair of transistors connected in parallel, whereby during the switched-on phase of the switching clock signal a first fraction of the current flowing through the input branch flows through the respective first transistor(s) of the pair or pairs, and a second fraction of the current flowing through the input branch flows through the respective second transistor(s) of the pair or pairs. During the switched-on phase of the switching clock signal, the overall current through the input branch is therefore split in such a way that the first fraction flows via the first transistors and the second fraction flows via the second transistors. During the off phase of the switching clock signal, the respective second transistors are switched off. In this way, the overall current through the input branch is reduced by the second fraction, or is limited to the first fraction. The magnitude of the first fraction, as well as of the second fraction, of the overall current can be set through the ratio W/L of the transistors used, as well as via the respective bias voltage present at the gate of the switching transistors.

Correspondingly, it is advantageous if the output branch of the pre-stage includes at least one pair of transistors connected in parallel, whereby the overall current through the output branch is again split, during the switched-on phase of the switching clock pulse, into a first fraction and a second fraction. The first fraction flows through the respective first transistors, and the second fraction flows through the respective second transistors of the pair or pairs. During the off phase of the switching clock signal, the respective second transistors are switched off in order to reduce the overall current through the output branch of the pre-stage.

According to a further advantageous specific embodiment of the invention, already before the beginning of the switched-on phase of the switching clock signal the device for reducing the current through the pre-stage increase the current flowing through the pre-stage from the smaller, second value to the first value. In this solution, the pre-stage and the end stage are no longer clocked in synchronous fashion. Instead, separate switching clock signals are provided for the pre-stage and the end stage. In this way, a stepped switching on and off of the pre-stage and of the end stage of the operational amplifier is possible, and, given a suitable tuning of the switching clock signals, the activation performance and the transient response can be improved.

Other features which are considered as characteristic for the invention are set forth in the appended claims.

Although the invention is illustrated and described herein as embodied in a switchable operational amplifier for switched op-amp applications, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

Figure 1:
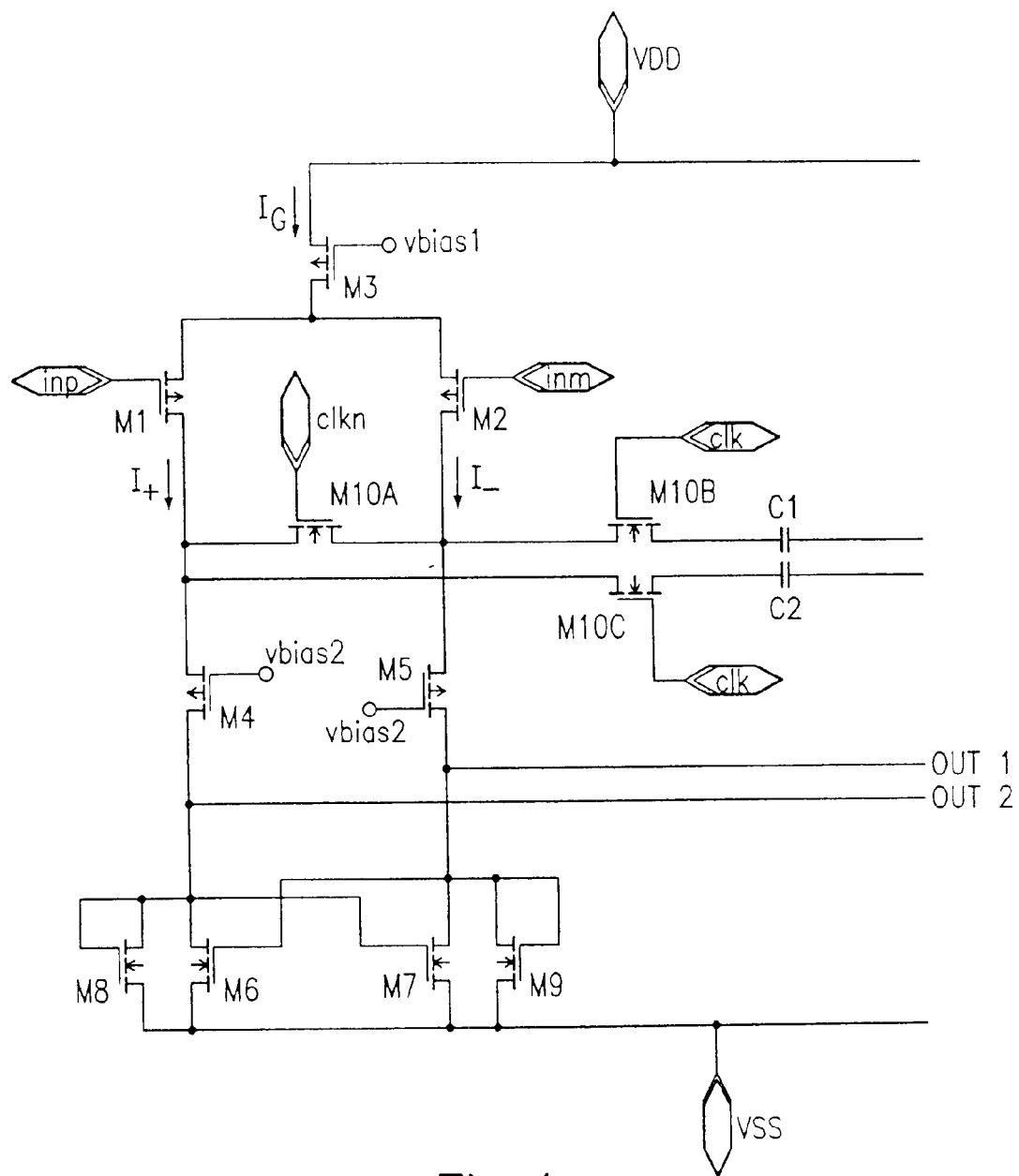
FIG. 1 is a circuit diagram of a pre-stage of an operational amplifier according to the prior art.

In all the figures of the drawing, sub-features and integral parts that correspond to one another bear the same reference symbol in each case. Referring now to the figures of the drawing in detail and first, particularly, to FIG. 1 thereof, there is shown a circuit of a pre-stage of an operational amplifier. A gate of p-MOSFET M1 represents a non-inverting input of the operational amplifier; a signal inp is present at the non-inverting input. Correspondingly, a gate of p-MOSFET M2 represents an inverting input of the operational amplifier; a signal inm is present at the inverting input. Device M3, at whose gate a constant pre-voltage vbias1 is present, acts as a constant-current source. Corresponding to the voltage difference of the two signals inp and inm present at the inputs, overall current $I_G$ is divided into the two subcurrents $I_+$ and $I_-$. The greater the difference between the input signals inp and inm, the more strongly the currents $I_+$ and $I_-$ differ.

Using the cascode stage, which includes transistors M4 and M5, and an active load made up of devices M6 to M9, the two currents $I_+$ and $I_-$ are converted into two voltage signals OUT1 and OUT2. The wiring of the FETs M6 to M9 has the effect that the load for the common-mode signal has only a low resistance, but the load for the difference signal has a very high resistance. In this way, a small change of the difference current results in a strong modification of the voltages present at the outputs OUT1 and OUT2.

This effect is further increased through the cascode stage. The cascode stage includes the two p-type MOSFETs M4 and M5, at whose respective gates a bias voltage vbias2 is present. The cascode stage effects an increasing of the resistance. The increase in resistance has the effect that small changes in current dI are converted into large changes in voltage dU. A slight modification of currents $I_+$ and $I_-$ correspondingly results in large fluctuations in the voltages present at the outputs OUT1 and OUT2. By the cascode stage and the nonlinear load, a high degree of voltage gain can thus be achieved in the pre-stage.

A FET M10A is used to protect the pre-stage from saturation. FETs M10B, M10C prevent a discharging of capacitors C1, C2 during the switched-off phase, so that the transient response is not adversely affected.

Figure 2:
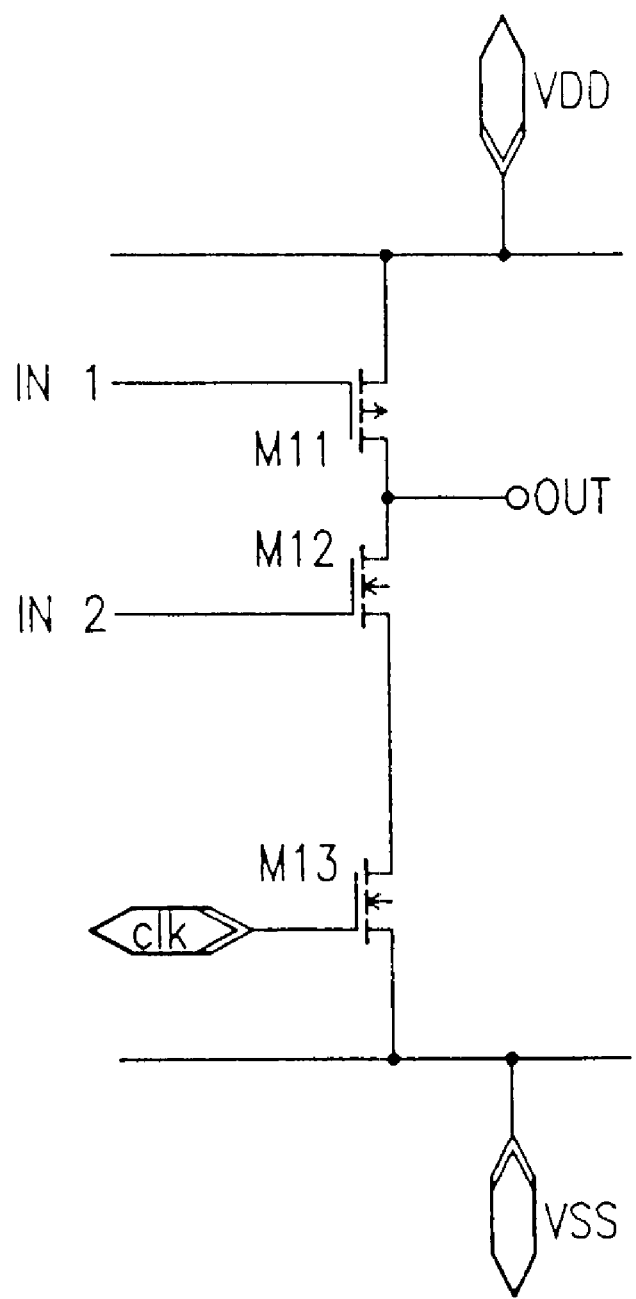
FIG. 2 is a circuit diagram of an end stage of an operational amplifier for switched op amp technology according to the prior art.

In the operational amplifiers known from the prior art for switched op amp technology, the pre-stage is permanently switched on, while the end stage is periodically switched on and off by the switching clock signal. FIG. 2 shows the circuit plan of such an end stage. An n-type FET M13 is clocked by switching clock signal clk. As long as the switching clock signal clk is at 1, the device M13 is conductive, whereas it blocks in the off phases of the switching clock signal. Input voltage signals IN1 and IN2 are supplied to the gates of the two FETs M11 and M12. In the switched-on state of the end stage, the two devices M11 and M12 act as voltage dividers, and divide the supply voltage VDD in dependence on the input voltage signals. At the output of the end stage, an output voltage signal OUT appears. During the off phase of the switching clock pulse, the signal OUT has a high resistance, or is at VDD, because through M13 the current path is divided to VSS.

Figure 3:
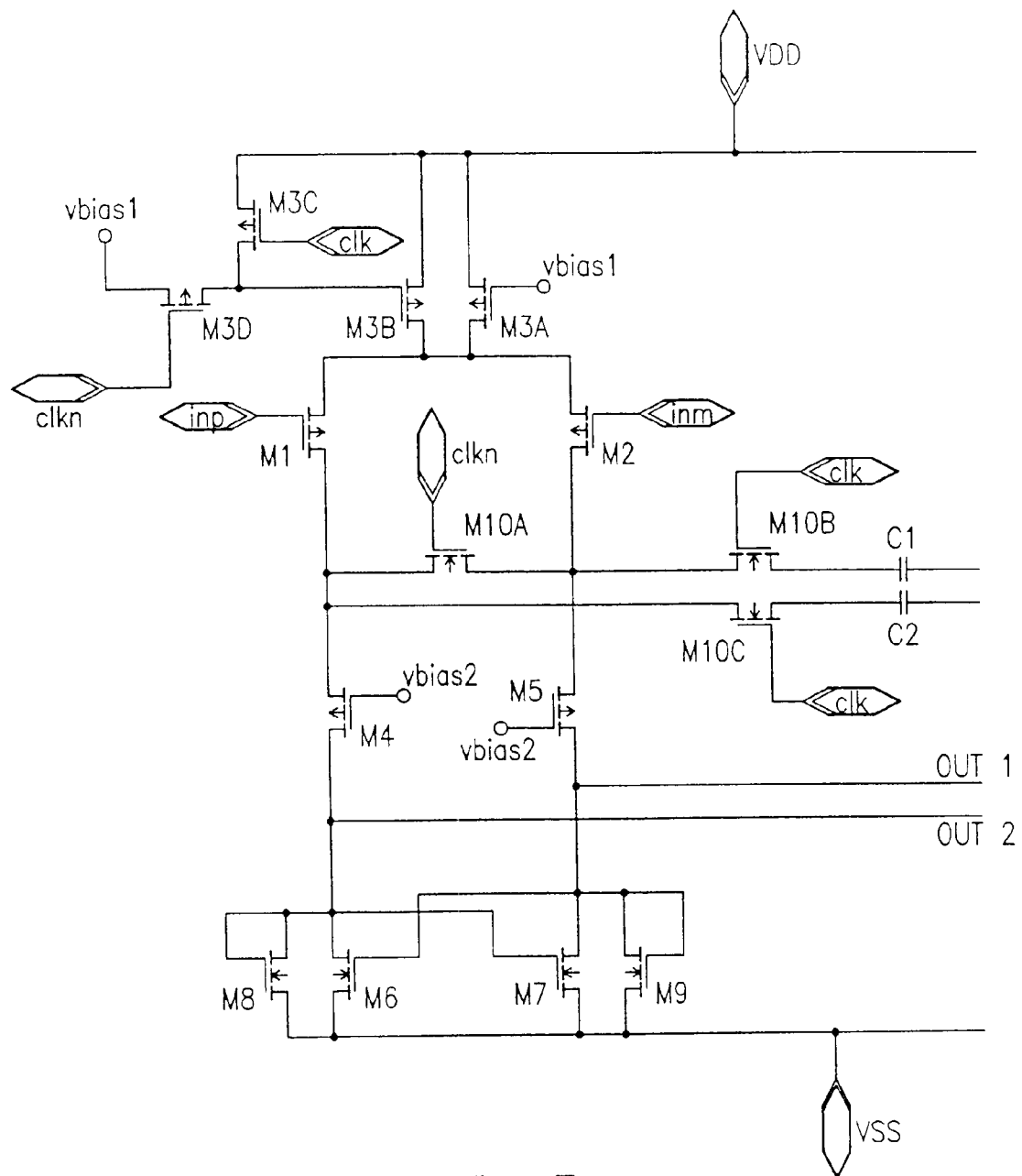
FIG. 3 is a circuit diagram of the pre-stage of the operational amplifier for switched op amp technology according to the invention.

FIG. 3 shows a pre-stage in which the configuration according to the invention is realized in order to reduce the pre-stage current during the switched-off phase of the switching clock pulse. For this purpose, two p-MOSFETs M3A and M3B, connected in parallel, are provided. A constant current flows via the device M3A both during the switched-on phase and during the switched-off phase. An additional p-type device M3B is connected in parallel to current-limiting device M3A, and supplies a contribution to the overall current $I_G=I_++I_-$ during the switched-on phases of the switching clock pulse.

During the switched-on phase of the switching clock pulse, the switching clock signal clk is at 1, while an inverted switching clock signal clkn is at 0. During the switched-on phase, the p-device M3C therefore blocks, while a p-device M3D conducts. The gate of current-limiting p-MOSFET M3B is therefore connected with the voltage vbias1 via the device M3D, and the FET M3B conducts. Therefore, during the switched-on phase a first fraction of overall current $I_G$ flows via the FET M3A, and a second fraction flows via the FET M3B.

The magnitudes of the contributions to the overall current that flow via the devices M3A and M3B is determined on the one hand through vbias1 and on the other hand through the geometric parameters of the two devices. The greater the ratio of a width W to a length L (W/L) of a MOSFET is, the more current flows, at a given gate voltage, via the source-drain path of this device. The current flowing through the device M3A during the switched-on phase is therefore determined by the W/L ratio of the device M3A, while the current through the FET M3B is determined by the W/L ratio of the FET M3B.

In the switched-off phase, the switching clock signal clk is at zero, while the inverted switching clock signal clkn is at 1. In the switched-off phase, the device M3D therefore blocks, while the device M3C conducts. The gate of the p-FET M3B is at VDD, via the device M3C, and is thus in the blocked state. In the switched-off phase of the switching clock pulse, no current therefore flows via the FET M3B; the overall current flowing during the switched-off phase flows via the device M3A.

The ratio of the control current through the FET M3B to the constant current through the FET M3A can be set via the respective W/L of the two devices, and, if the length L is kept constant, via the ratio of the widths W. The widths W(M3A) and W(M3B) can be related to the width of the FET M3 from FIG. 1 with the aid of split factors spl1 and spl2:

$W(M3A)=W(M3)*spl1$ $W(M3B)=W(M3)*spl2$, whereby the split factors spl1 and spl2 can assume values between 0 and 1. If the modified operational amplifier according to FIG. 3 is supposed to have, in the switched-on phase, the same behavior as the operational amplifier in FIG. 1, then spl1+spl2=1 must hold.

The greater the split value spl2 is chosen in comparison to the split value spl1, the greater the switchable current portion will be in comparison to the constant-current portion, and the more strongly reduced will be the current during the switched-off phase. However, it is recommended to maintain a certain minimum current through the pre-stage even during the switched-off phase, because otherwise the activation performance becomes worse. To this extent, the ratio of the split values spl1 and spl2 represents a compromise between activation performance and current savings.

If the quotient of the split values spl1 and spl2 is for example 1:3, the current consumption of the input stage in the switched-off phase of the operational amplifier is reduced to ¼. Taking both clock phases into consideration, given a pulse-duty factor of 50% a power savings of approximately ⅝ results.

Figure 4:
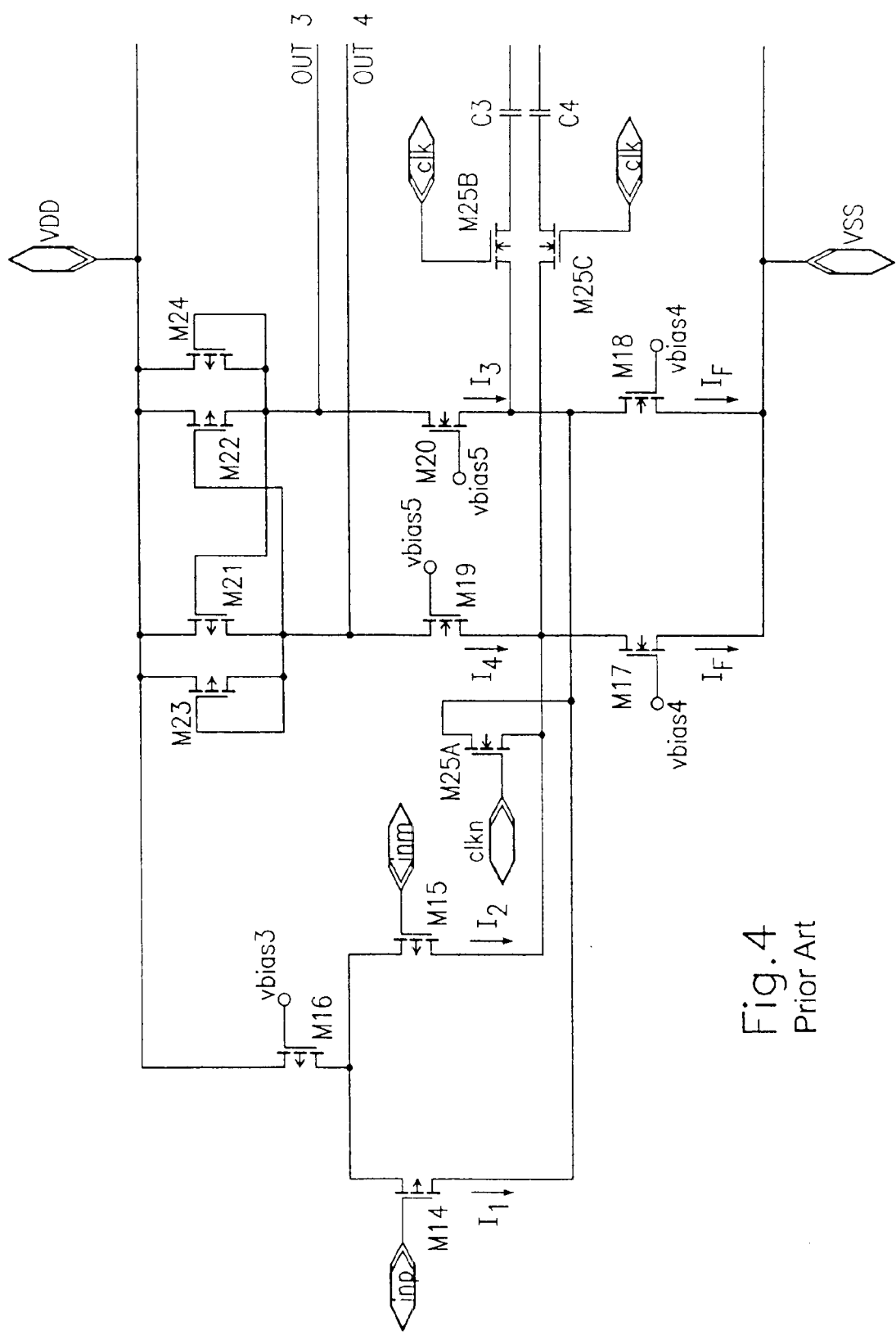
FIG. 4 is a convoluted pre-stage of the operational amplifier according to the prior art.

FIG. 4 shows a convoluted pre-stage, known from the prior art, that includes an input branch having FETs M14, M15 and M16, as well as an output branch having FETs M17 to M24. The input signals inp and inm are present at the gates of the devices M14 and M15, and determine how the overall current determined through the FET M16 and vbias3 is divided into currents $I_1$ and $I_2$. Transistors M17 and M18, at each of whose gates a pre-voltage vbias4 is present, each act as a constant-current regulator; current $I_F$ flows through each of them. If changing current $I_1$ is subtracted from constant current $I_F$, current $I_3$ is obtained. Correspondingly, a current $I_4$ is obtained by subtracting changing current $I_2$ from constant current $I_F$. The currents in the input branch are therefore each led off one to one into the output branch of the folded pre-stage.

Via the nonlinear load consisting of devices M21 to M24, and the cascode stage (devices M19, M20), currents $I_3$ and $I_4$ are converted into output voltage signals OUT3 and OUT4. The output voltage signals are then supplied to the end stage of the operational amplifier.

A convoluted pre-stage is advantageous in particular given low supply voltages, because the folding of the current path allows a better exploitation of the voltage. Despite a low supply voltage, a high degree of gain can be achieved.

A FET M25A is used to protect the pre-stage from saturation. FETs M25B, M25C prevent a discharging of capacitors C3, C4 during the switched-off phase, so that the transient response is not adversely affected.

Figure 5:
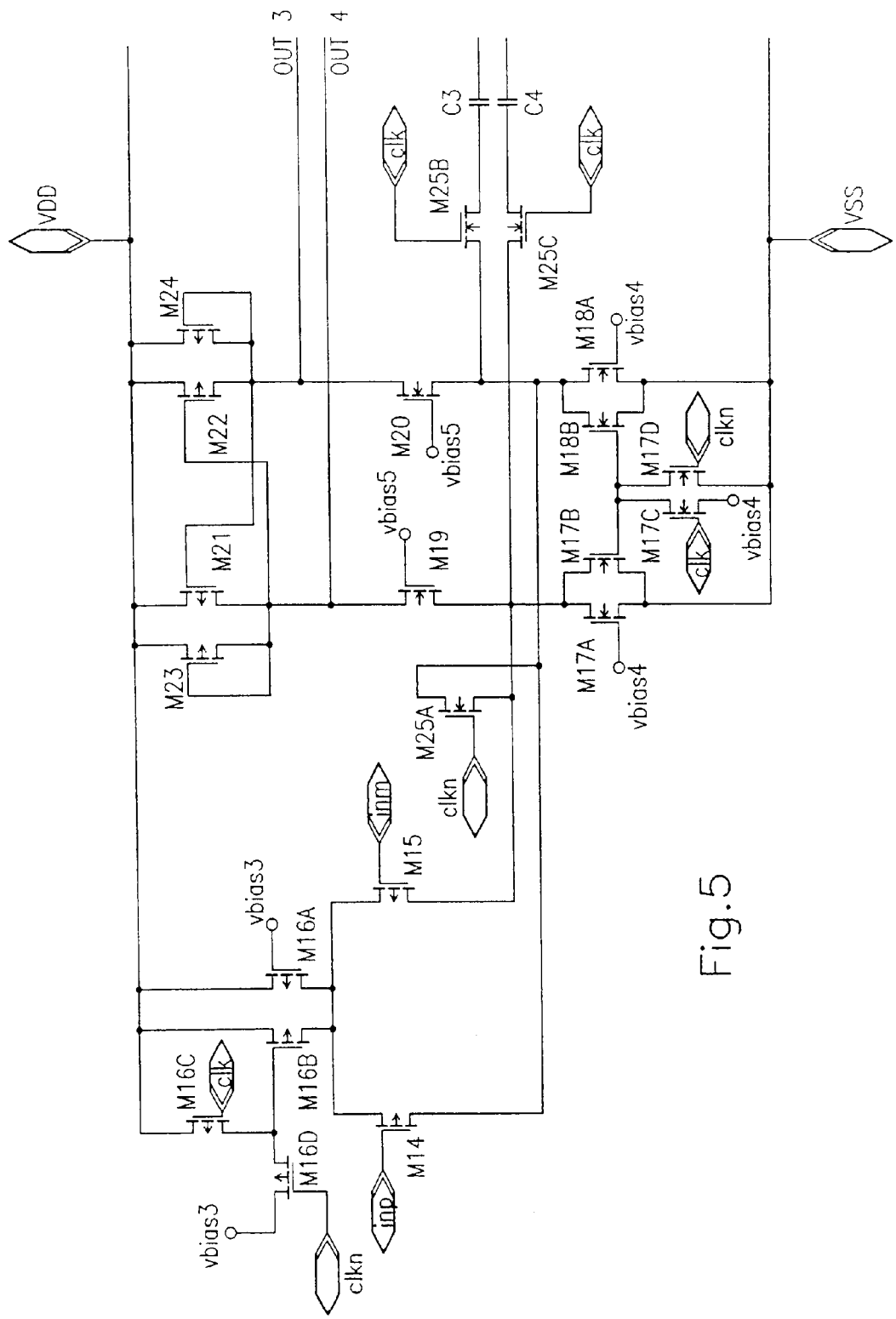
FIG. 5 is a convoluted folded pre-stage of the operational amplifier for switched op amp technology according to the invention.

FIG. 5 shows a convoluted pre-stage according to the invention. The transistors acting as the current sources (M16, M17, M18 in FIG. 4) are respectively split into devices M16A, M16B, M17A, M17B, M18A, M18B. A constant current flows constantly through each of the transistors M16A, M17A, and M18A. In addition, a current portion that, according to the invention, is shut off during the off phase of the switching clock pulse flows through the transistors M16B, M17B, and M18B, which are connected in parallel. In the solution shown in FIG. 5, during the switched-off phase of the switching clock pulse both the current through the input branch and also the current through the output branch of the pre-stage of the operational amplifier are reduced. However, it is also possible to realize only the current in the input branch, or only the current in the output branch, in switchable fashion.

In the solution shown in FIG. 5, the device M16D connects during the switched-on phase of the switching clock signal, while in contrast the device M16C is in the blocked state. For this reason, the voltage vbias3 is present at the gate of the p-MOSFET M16B, and the FET M16B conducts. Therefore, in the switched-on phase of the switching clock signal both the flow of current through the FET M16A and the flow of current through the FET M16B contribute to the overall current.

In the off phase of the switching clock pulse, the FET M16D blocks, while the FET M16C conducts. The gate of the device M16B is at VDD via the FET M16C, and the device M16B therefore blocks. In this way, the overall current flow is reduced to the current contribution flowing through the FET M16A.

The current regulation in the folded stage functions in a similar manner. The constant-current portion flows here via the devices M17A and M18A, while the current portion through the devices M17B and M18B can be switched off. As long as switching clock signal clk is at 1, the n-MOSFET M17C conducts, while in contrast the n-MOSFET M17D blocks. For this reason, the gates of the two devices M17B and M18B are at vbias4, and the devices M17B and M18B contribute to the overall current. If, in contrast, the switching clock signal is at 0, then the gates of the devices M17B and M18B are connected with VSS via the FET M17D, and no current flows through the FETs M17B and M18B.

If the length L is kept constant, the ratio of the constant current to the controllable current can be determined via the width W of the devices. With the aid of the split factors spl1 and spl2, it is possible to relate the width of the split devices to the width of the devices shown in FIG. 4:

$$W(M16A)=W(M16)*spl1$$

$$W(M16B)=W(M16)*spl2$$

$$W(M17A)=W(M17)*spl1$$

$$W(M17B)=W(M17)*spl2$$

$$W(M18A)=W(M18)*spl1$$

$$W(M18B)=W(M18)*spl2$$

The split factors spl1 and spl2 can thereby assume values between 0 and 1. If the split factors spl1+spl2=1, then during the switched-on phase the modified pre-stage has the same behavior as the pre-stage shown in FIG. 4. The greater the split factor spl2 is chosen, the greater the current savings is.

Figure 6:
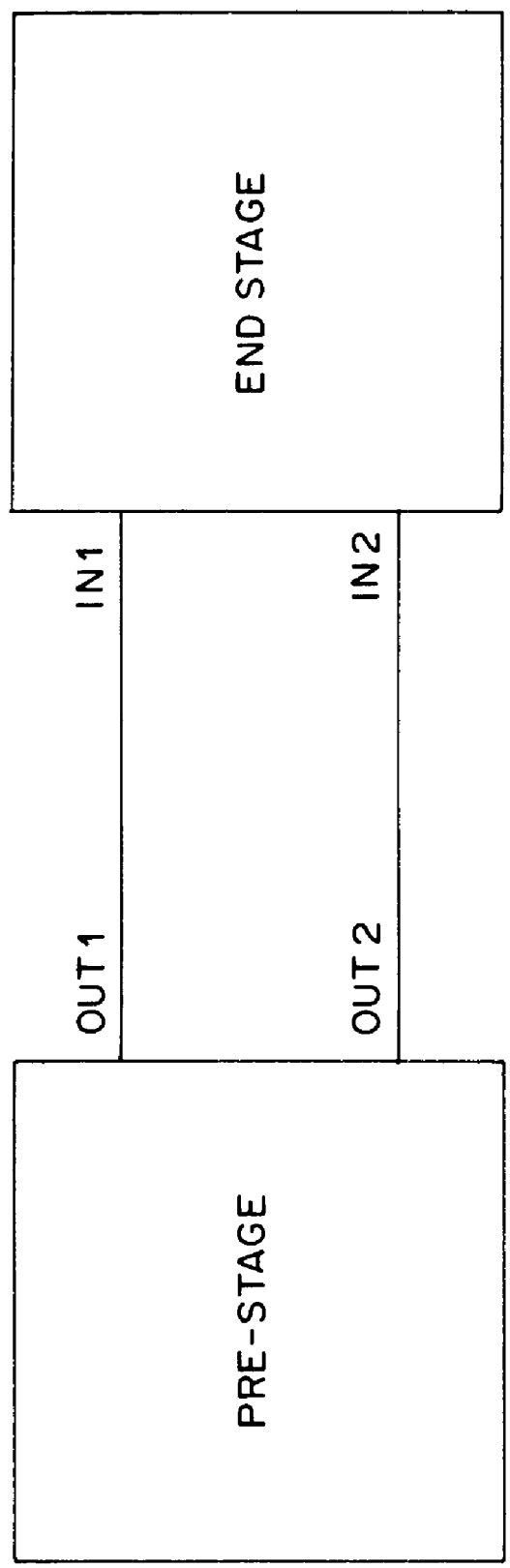
FIG. 6 shows the connection between the pre-stage shown in FIG. 2 and the end stage shown in FIG. 3.

FIG. 6 shows the connection between the pre-stage shown in FIG. 2 and the end stage shown in FIG. 3. As can be seen from FIG. 6, the output OUT1 of the pre-stage is connected to the input IN1 of the end stage and the output OUT2 of the pre-stage is connected to the input IN2 of the end stage.

We claim:

1. A switchable operational amplifier for switched op amp technology, comprising:
    an end stage periodically switched on and off by a switching clock signal; and
    a pre-stage connected to said end stage and having a device for reducing a current through said pre-stage, said device operating to reduce the current flowing through said pre-stage during an off phase of the switching clock signal from a first value to a smaller non-zero second value.

2. The switchable operational amplifier according to claim 1, wherein said device for reducing the current through said pre-stage switches off the current flowing through said pre-stage during the off phase of the switching clock signal.

3. The switchable operational amplifier according to claim 2, wherein said device for reducing the current through said pre-stage includes at least one transistor that switches off the current flowing through said pre-stage during the off phase of the switching clock signal.

4. The switchable operational amplifier according to claim 1, wherein said device for reducing the current through said pre-stage includes at least one pair of transistors connected in parallel, and during a switched-on phase of the switching clock signal, a first fraction of the current flowing through said pre-stage flows through a first transistor of said pair, and a second fraction of the current flowing through said pre-stage flows through a second transistor of said pair, and during the off phase of the switching clock signal, said second transistor is switched off.

5. The switchable operational amplifier according to claim 1, wherein said pre-stage is a convoluted pre-stage containing an input branch and an output branch, and said device for reducing the current through said pre-stage reduces at least one of a current flowing in said input branch and a current flowing in said output branch during the off phase of the switching clock signal.

6. The switchable operational amplifier according to claim 5, wherein said input branch includes at least one pair of transistors connected in parallel and having a first transistor and a second transistor, during a switched-on phase of the switching clock signal, a first fraction of the current flowing through said input branch flows through said first transistor of said pair, and a second fraction of the current flowing through said input branch flows through said second transistor of said pair, and during the off phase of the switching clock signal, said second transistor is switched off.

7. The switchable operational amplifier according to claim 5, wherein said output branch includes at least one pair of transistors connected in parallel and having a first transistor and a second transistor, during a switched-on phase of the switching clock signal, a first fraction of the current flowing through said output branch flows through said first transistor of said
    pair, and a second fraction of the current flowing through said output branch flows through said second transistor of said pair, and during the off phase of the switching clock signal, said second transistor is switched off.

8. The switchable operational amplifier according to claim 1, wherein already before a beginning of a switched-on phase of the switching clock signal, said device for reducing the current increases the current flowing through said pre-stage from the smaller second value to the first value.

9. A method for operating a switchable operational amplifier having a pre-stage and an end stage periodically switched on and off by a switching clock signal, which method comprises the step of:
    reducing a current flowing through the pre-stage during an off phase of the switching clock signal, from a first value to a smaller non-zero second value.

10. The method according to claim 9, which comprises switching off the current flowing through the pre-stage during the off phase of the switching clock signal.

11. The method according to claim 10, which comprises switching off the current flowing through the pre-stage which flows through a transistor that is switched off during the off phase of the switching clock signal.

12. The method according to claim 9, which comprises providing the pre-stage with at least one pair of transistors that are connected in parallel and include a first transistor and a second transistor, during a switched-on phase of the switching clock signal, a first fraction of the current flowing through the pre-stage flows through the first transistor of the pair, and a second fraction of the current flowing through the pre-stage flows through the second transistor, and during the off phase of the switching clock signal, the second transistor is switched off.

13. The method according to claim 9, which comprises providing the pre-stage as a convoluted pre-stage that has an input branch and an output branch, and during the off phase of the switching clock signal at least one of a current flowing in the input branch and the current flowing in the output branch is reduced.

14. The method according to claim 13, which comprises providing the input branch of the pre-stage with at least one pair of transistors that are connected in parallel and include a first transistor and a second transistor, during a switched-on phase of the switching clock signal, a first fraction of the current flowing through the input branch flows through the first transistor of the pair, and a second fraction of the current flowing through the input branch flows through the second transistor of the pair, and during the off phase of the switching clock signal, the second transistor is switched off.

15. The method according to claim 13, which comprises providing the output branch of the pre-stage with at least one pair of transistors connected in parallel and include a first transistor and a second transistor, during a switched-on phase of the switching clock signal, a first fraction of the current flowing through the output branch flows through the first transistor of the pair, and a second fraction of the current flowing through the output branch flows through the second transistor of the pair, and during the off phase of the switching clock signal, the second transistor is switched off.

16. The method according to claim 9, which comprises increasing the current flowing through the pre-stage from the smaller second value to the first value before a beginning of a switched-on phase of the switching clock signal.

* * * * *